(12) United States Patent
Kim et al.

(10) Patent No.: US 9,288,902 B2
(45) Date of Patent: Mar. 15, 2016

(54) PRINTED CIRCUIT BOARD AND METHOD OF MANUFACTURING THE SAME

(71) Applicant: SAMSUNG ELECTRO-MECHANICS CO., LTD., Suwon (KR)

(72) Inventors: Eun Sil Kim, Suwon (KR); Sung Han Kim, Suwon (KR); Sa Yong Lee, Suwon (KR); Jin Ho Hong, Suwon (KR); Yong Il Kwon, Suwon (KR); Sang Hyun Shin, Suwon (KR); Keun Yong Lee, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 49 days.

(21) Appl. No.: 14/097,049

(22) Filed: Dec. 4, 2013

(65) Prior Publication Data

US 2015/0053469 A1  Feb. 26, 2015

(30) Foreign Application Priority Data

Aug. 23, 2013 (KR) .................. 10-2013-0100630

(51) Int. Cl.
| | |
|---|---|
| H05K 1/00 | (2006.01) |
| H05K 1/03 | (2006.01) |
| G03F 7/40 | (2006.01) |
| H05K 3/10 | (2006.01) |
| H05K 3/12 | (2006.01) |
| H05K 1/02 | (2006.01) |
| H05K 3/40 | (2006.01) |
| H05K 3/42 | (2006.01) |

(52) U.S. Cl.
CPC ............... *H05K 1/0306* (2013.01); *G03F 7/40* (2013.01); *H05K 3/107* (2013.01); *H05K 3/1258* (2013.01); *H05K 1/0274* (2013.01); *H05K 1/0393* (2013.01); *H05K 3/4061* (2013.01); *H05K 3/426* (2013.01); *H05K 2201/0376* (2013.01)

(58) Field of Classification Search
CPC .......... H01L 31/18; H01L 51/52; G02B 5/02; G02F 1/13; G02F 1/1335; H05B 33/10
USPC ................. 174/258; 257/89, 232; 345/82, 87; 349/43, 113, 138, 147, 148; 428/156, 428/195.1, 209, 690; 438/64
See application file for complete search history.

(56) References Cited

U.S. PATENT DOCUMENTS

| | | | | |
|---|---|---|---|---|
| 5,124,823 | A * | 6/1992 | Kawasaki et al. | 349/138 |
| 5,212,575 | A * | 5/1993 | Kojima et al. | 349/147 |
| 5,514,888 | A * | 5/1996 | Sano et al. | 257/232 |
| 5,828,434 | A * | 10/1998 | Koden et al. | 349/148 |
| 6,208,395 | B1 * | 3/2001 | Kanoh et al. | 349/113 |
| 6,414,735 | B1 * | 7/2002 | Kim et al. | 349/113 |
| 6,563,435 | B1 * | 5/2003 | Platz | 341/34 |
| 6,819,309 | B1 * | 11/2004 | Kishi | 345/87 |
| 6,836,305 | B1 * | 12/2004 | Kagawa et al. | 349/113 |
| 2002/0030647 | A1 * | 3/2002 | Hack et al. | 345/82 |
| 2002/0086222 | A1 * | 7/2002 | Migitaka et al. | 430/5 |
| 2003/0203458 | A1 * | 10/2003 | Kozaki et al. | 435/135 |
| 2005/0008894 | A1 * | 1/2005 | Hiruma et al. | 428/690 |

(Continued)

*Primary Examiner* — Xiaoliang Chen
(74) *Attorney, Agent, or Firm* — NSIP Law

(57) ABSTRACT

Disclosed herein are a printed circuit board and a method of manufacturing the same.
The printed circuit board includes a light-blocking glass substrate; a negative photosensitive insulating layer formed on the glass substrate; and a circuit pattern formed on the glass substrate and embedded in the negative photosensitive insulating layer.

5 Claims, 6 Drawing Sheets

(56) References Cited

U.S. PATENT DOCUMENTS

| | | |
|---|---|---|
| 2005/0079331 A1* | 4/2005 | Ikeda et al. .................. 428/209 |
| 2006/0070769 A1 | 4/2006 | Kim |
| 2006/0105148 A1* | 5/2006 | Cok et al. .................. 428/195.1 |
| 2009/0081480 A1* | 3/2009 | Takeda et al. ................. 428/690 |
| 2011/0039205 A1* | 2/2011 | Suzuki et al. .............. 430/270.1 |
| 2011/0151195 A1* | 6/2011 | Mitsukura et al. ............ 428/156 |
| 2011/0180826 A1* | 7/2011 | Morito et al. ................... 257/89 |
| 2011/0312120 A1* | 12/2011 | Weiner et al. ................... 438/64 |
| 2013/0044162 A1* | 2/2013 | Zhao et al. ...................... 347/44 |
| 2013/0101980 A1* | 4/2013 | Domey et al. ................. 434/408 |
| 2013/0308071 A1* | 11/2013 | Kim et al. ....................... 349/43 |

\* cited by examiner

PRINTED CIRCUIT BOARD AND METHOD OF MANUFACTURING THE SAME

CROSS REFERENCE TO RELATED APPLICATION

This application claims the benefit of Korean Patent Application No. 10-2013-0100630, filed on Aug. 23, 2013, entitled "Printed Circuit Board and Method of Manufacturing the Same," which is hereby incorporated by reference in its entirety into this application.

BACKGROUND OF THE INVENTION

1. Technical Field

The present invention relates to a printed circuit board and a method of manufacturing the same.

2. Description of the Related Art

In recent days, electronic devices are being rapidly developed to perform multiple functions and operate faster. Accordingly, semiconductor chips and printed circuit boards on which semiconductor chips are mounted are also rapidly being developed. Such printed circuit boards are required to be light, thin and simple, while being implemented with microcircuits, in addition to have good electric property, high reliability, and high speed signal transmission.

In the prior art, in forming circuit patterns on a printed circuit board, circuit patterns are formed first and then insulating layers are formed. Circuit patterns may be formed by forming plating layers on insulating layers and then etching the plating layers to perform patterning. Alternatively, circuit patterns may be formed by forming seed layers on insulating layers, forming plating resist having openings patterned therein, performing plating, removing the plating resists, and etching the seed layers. US Patent Application Publication No. 2006/0070769 discloses such a circuit pattern method. In this method, when plating layers or seed layers are etched by wet etching using etchant, under cuts occur on circuit patterns due to the property of isotropic etchant. Especially when micro patterns are formed, there are problems such as loss of circuit patterns due to under cuts.

SUMMARY OF THE INVENTION

The present invention has been made in an effort to provide a printed circuit board capable of preventing undercuts on circuit patterns and a method of manufacturing the same.

Further, the present invention has been made in an effort to provide a printed circuit board having high rigidity and a method of manufacturing the same.

In addition, the present invention has been made in an effort to provide a printed circuit board capable of reducing warpage and a method of manufacturing the same.

Moreover, the present invention has been made in an effort to provide a printed circuit board capable of saving cost and a method of manufacturing the same.

According to a first preferred embodiment of the present invention, there is provided a printed circuit board including: a light-blocking glass substrate; a negative photosensitive insulating layer formed on the glass substrate; and a circuit pattern formed on the glass substrate and embedded in the negative photosensitive insulating layer.

The printed circuit board may further include a through via penetrating through the glass substrate and connected to the circuit pattern.

The printed circuit board may further include an adhesive layer formed between the glass substrate and the negative photosensitive insulating layer.

The glass substrate may be opaque.

The glass substrate may be formed of a flexible glass plate.

The negative photosensitive insulating layer may be formed on either side of the glass substrate.

According to a second preferred embodiment of the present invention, there is provided a method of manufacturing a printed circuit board, including: providing a light-blocking glass substrate; forming a negative photosensitive insulating layer on the glass substrate; forming an opening in the negative photosensitive insulating layer; and forming a circuit pattern by filling the opening with a conductive material.

The glass substrate may be opaque.

The glass substrate may be formed of a flexible glass plate.

The forming of the opening in the negative photosensitive insulating layer may include: performing an exposure process on an area on the negative photosensitive insulating layer other than the area where the opening is to be formed; and performing a development process to form the opening.

The performing of the exposure process may include: forming a mask over the negative photosensitive insulating layer, the mask being patterned to protect an area where the opening is to be formed and to expose other areas; performing the exposure process on the areas exposed through the mask on the negative photosensitive insulating layer; and removing the mask.

The performing of the exposure process may include performing the exposure process on the area on the negative photosensitive insulating layer other than the area where the opening is to be formed by laser direct imaging (LDI).

The forming of the circuit pattern may include filling the opening with conductive paste by screen printing.

The forming of the circuit pattern may include filling the opening with conductive ink by an inkjet method.

The forming of the circuit pattern may include: forming seed layers on the negative photosensitive insulating layer and the opening; forming a plating layer on the seed layers such that the opening is filled by plating; and forming the circuit pattern by polishing the plating layer until the one surface of the negative photosensitive insulating layer are exposed.

The method may further include, after the forming of the opening, forming a through via-hole penetrating through the glass substrate.

The through via hole may be formed using a CNC drill or a laser drill.

The forming of the circuit pattern may further include forming a through via by filling the through via hole with the conductive material.

The method may further include, before the forming of the negative photosensitive insulating layer, forming an adhesive layer on the glass substrate.

The negative photosensitive insulating layer may be formed on either side of the glass substrate.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
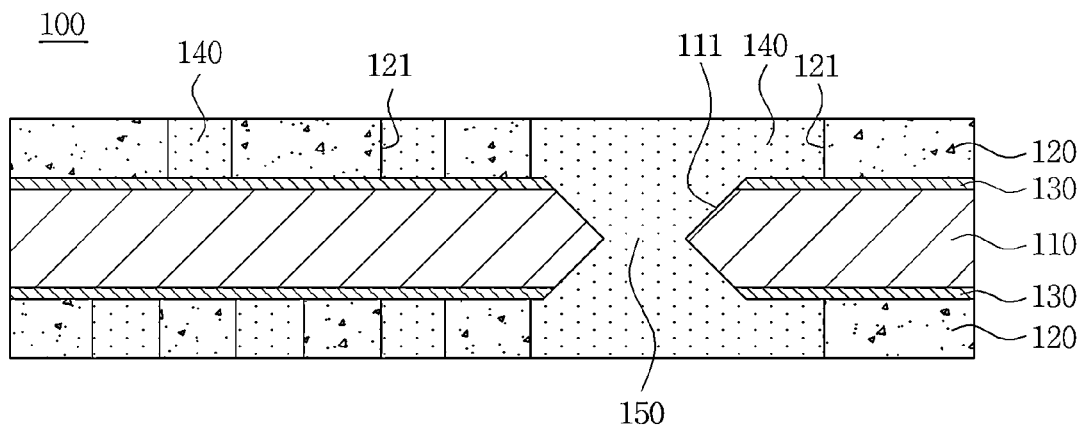
FIG. 1 is a view showing a printed circuit board according to a preferred embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

FIG. 1 is a view showing a printed circuit board according to a preferred embodiment of the present invention.

Referring to FIG. 1, the printed circuit board 100 may include a glass substrate 110, negative photosensitive insulating layers 120, circuit patterns 140 and a through via 150.

The glass substrate 110 may be a light-blocking glass plate. The glass substrate 110 may have so low transparency as not to allow exposure to pass through the glass substrate 110 when an exposure process is performed on the negative photosensitive insulating layers 120. For example, the glass substrate 110 may be an opaque glass plate. In addition, the glass substrate 110 may be formed of a flexible glass plate. In case that the negative photosensitive insulating layers 120 are formed on the glass substrate 110 formed of a flexible glass substrate 110, a roll-to-roll technique may be applied as well as existing techniques. The glass substrate 110 may serve to insulate the circuit patterns 140 from one another.

The negative photosensitive insulating layers 120 may be formed on the glass substrate 110. In FIG. 1, although the negative photosensitive insulating layers 120 may be formed on both sides of the glass substrate 110, the present invention is not limited thereto. The negative photosensitive insulating layers 120 may be formed on only one side of the glass substrate 110 depending on a designer's choice.

The negative photosensitive insulating layers 120 may not only insulate the circuit patterns 140 from one another but also serve as a resist. During an exposure process, photo polymerization reaction arises on a part of the negative photosensitive insulating layers 120 where light is irradiated, such that monomer molecules together forms three-dimensional networks having polymer chains, and cured. Thereafter, by performing a development process, uncured portions are removed and thereby patterning is achieved. The negative photosensitive insulating layers 120 are formed of long chain polymer molecules and are advantageous in that they are cheaper than positive photosensitive insulating layers.

The negative photosensitive insulating layers 120 may have openings 121 patterned through exposure and development processes described above. The openings 121 are formed where the circuit patterns 140 are formed and may expose the glass substrate 110 therethrough.

The circuit patterns 140 may be formed in the openings 121 of the negative photosensitive insulating layer 120. The circuit patterns 140 may be formed on the glass substrate 110 and may be embedded in the negative photosensitive insulating layers 120. The circuit patterns 140 may be made of a conductive material. For example, the circuit patterns 140 may be formed of copper (Cu). However, the material of the circuit patterns 140 is not limited to copper. Any of conductive materials used in the circuit board field may be used for the circuit patterns 140. The circuit patterns 140 may be formed using any of a screen print method, an inkjet method and a plating method. In the case that the circuit patterns 140 are formed using the plating method, an electroless plating method and an electro plating method may be applied.

The through via 150 may penetrate through the glass substrate 110. In addition, the through via 150 may electrically connect the circuit patterns 140 formed on both surfaces of the glass substrate 110. The through via 150 may be made of a conductive metal. The through via 150 may be made of the same material with that of the circuit patterns 140. However, the through via 150 need not necessarily be formed of the same material with that of the circuit patterns 140, but any of conductive materials used in the circuit board field may be used.

According to a preferred embodiment of the present invention, the printed circuit board 100 may further include adhesive layers 130. The adhesive layers 130 may be formed on the glass substrate 110. The adhesive layers 130 may be formed in order to enhance the adhesion between the glass substrate 110 and the negative photosensitive insulating layers 120. Any of adhesive materials used in the circuit board field may be used for the adhesive layers 130. In the present invention, the adhesive layers 130 are not essential elements, and may or may not be employed as required by those skilled in the art.

The printed circuit board according to the preferred embodiments of the present invention uses a glass substrate, so that it has higher rigidity and is less deformed by changes in temperature and humidity. Accordingly, warpage of the printed circuit board is reduced. Moreover, the flexible glass substrate has low brittleness so that it is less likely to be broken by external impacts and is applicable to a printed circuit board having a curved surface. Further, the printed circuit board uses the negative photosensitive insulating layers, so that it is possible to save cost, compared with positive photosensitive insulating layers.

FIGS. 2 to 14 are views illustrating a method of manufacturing a printed circuit board according to a preferred embodiment of the present invention.

Figure 2:
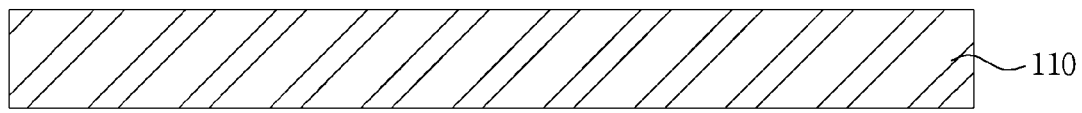
FIGS. 2 to 14 are views illustrating a method of manufacturing a printed circuit board according to a preferred embodiment of the present invention.

Referring to FIG. 2, a glass substrate 110 is provided.

The glass substrate 110 may be a light-blocking glass plate. The glass substrate 110 may have so low transparency as not to allow exposure to pass through the glass substrate 110 when an exposure process is performed on the negative photosensitive insulating layers 120. For example, the glass substrate 110 may be an opaque glass plate. In addition, the glass substrate 110 may be formed of a flexible glass plate. The glass substrate 110 is formed of an insulating material and may serve to insulate circuit patterns (not shown) to be formed from one another.

Figure 3:
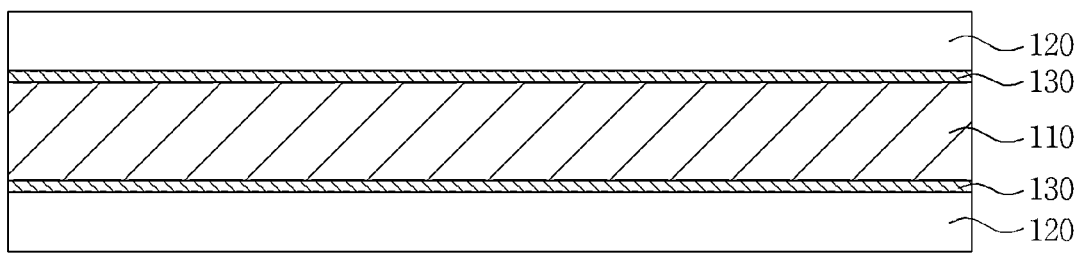

Referring to FIG. 3, the negative photosensitive insulating layers 120 may be formed on the glass substrate 110.

The negative photosensitive insulating layers 120 may not only insulate the circuit patterns 140 from one another but also serve as a resist. The negative photosensitive insulating layers 120 are formed of long chain polymer molecules and are advantageous in that they are cheaper than positive photosensitive insulating layers.

In FIG. 3, although the negative photosensitive insulating layers 120 may be formed on both sides of the glass substrate 110, the present invention is not limited thereto. The negative photosensitive insulating layers 120 may be formed on only one side of the glass substrate 110 depending on a designer's selection.

For example, the negative photosensitive insulating layers 120 may be formed on the glass substrate 110 by a roll-to-roll process. Here, the negative photosensitive insulating layers 120 may be formed of a negative photosensitive material film. In a preferred embodiment of the present invention, the glass substrate 110 is flexible so that the roll-to-roll process may be applied. By using the roll-to-roll process, the flattening of the negative photosensitive insulating layers 120 formed on the glass substrate 110 can be improved.

However, the method of forming the negative photosensitive insulating layers 120 on the glass substrate 110 is not limited to the roll-to-roll process. The negative photosensitive insulating layers 120 may be formed by coating ink, paste or varnish of negative photosensitive material.

According to a preferred embodiment of the present invention, adhesive layers 130 may be further formed on the glass substrate 110 before the negative photosensitive insulating layers 120 are formed. The adhesive layers 130 may be formed in order to enhance the adhesion between the glass substrate 110 and the negative photosensitive insulating layers 120. The adhesive layers 130 may be formed of any material which is non-conductive and used in the circuit board field for enhancing adhesion.

Figure 4:
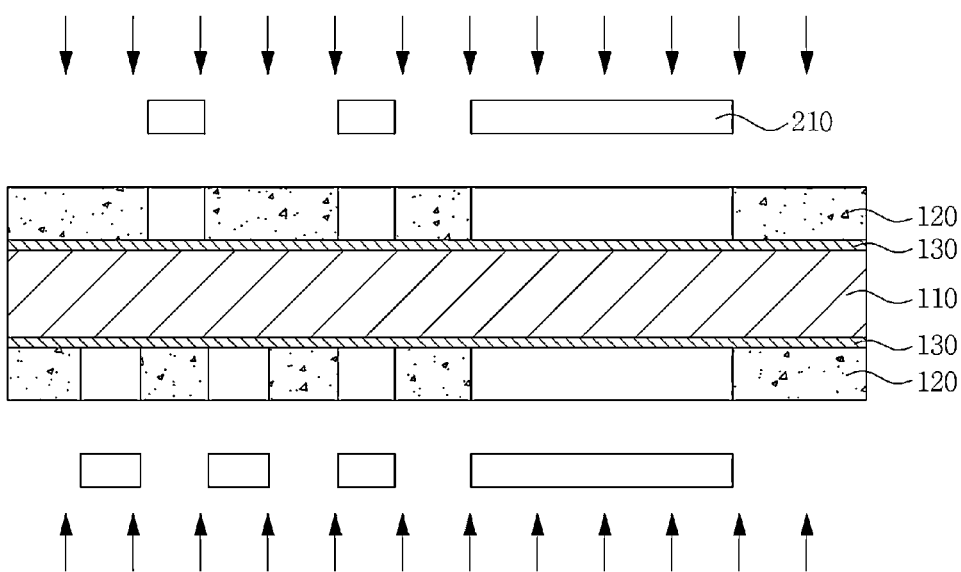

Referring to FIG. 4, an exposure process is performed on the negative photosensitive insulating layers 120.

Initially, masks 210 may be formed on the negative photosensitive insulating layers 120. The masks 210 may be patterned such that areas where openings (not shown) of the negative photosensitive insulating layers 120 are to be formed are protected. Here, the openings (not shown) are the areas where circuit patterns (not shown) are to be formed and are to be removed in a later development process. That is, the masks 210 may be patterned such that areas of the negative photosensitive insulating layers 120 where circuit patterns (not shown) are to be formed are protected.

The exposure process may be performed by placing patterned masks 210 over the negative photosensitive insulating layers 120 to irradiate light thereto. The light irradiated to the negative photosensitive insulating layers 120 may be ultraviolet rays or laser beams. By performing the exposure process, photo polymerization reaction arises on a part of the negative photosensitive insulating layers 120 where light is irradiated, such that monomer molecules together forms three-dimensional networks having polymer chains, and cured.

In FIG. 4, the exposure process on the negative photosensitive insulating layers 120 is shown to use the masks 210, the exposure method is not limited thereto. Although not shown, the exposure process on the negative photosensitive insulating layers 120 may be performed using a laser direct imaging (LDI) method so that no mask 210 is used and exposure may be performed only on desired areas.

Figure 5:
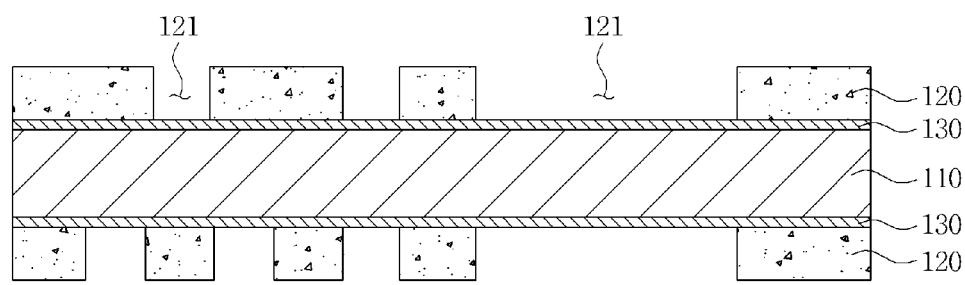

Referring to FIG. 5, openings 121 are performed in the negative photosensitive insulating layers 120.

A development process may be performed on the negative photosensitive insulating layers 120 on which the exposure process is performed. After the exposure process, areas on the negative photosensitive insulating layers 120 which were protected by the masks (210 in FIG. 4) and thus uncured may be removed by a developer. By performing such exposure and development processes, openings 121 may be formed in the negative photosensitive insulating layers 120 where circuit patterns (not shown) are to be formed. The openings 121 may expose the glass substrate 110 therethrough.

Figure 6:
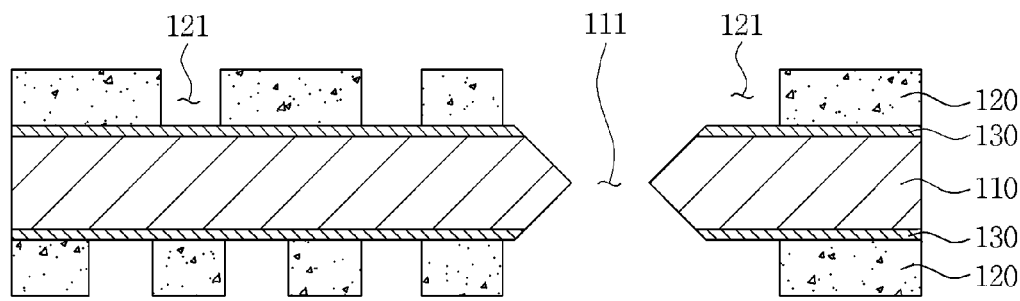

Referring to FIG. 6, a through via hole 111 may be formed.

The through via hole 111 has a through via 150 formed therein to electrically connect circuit patterns (not shown) to be formed on both surfaces of the glass substrate 110 to one another. Therefore, the through via hole 111 may penetrate through the glass substrate 110. The through via hole 111 may be formed using a CNC drill or a laser drill.

Figure 7:
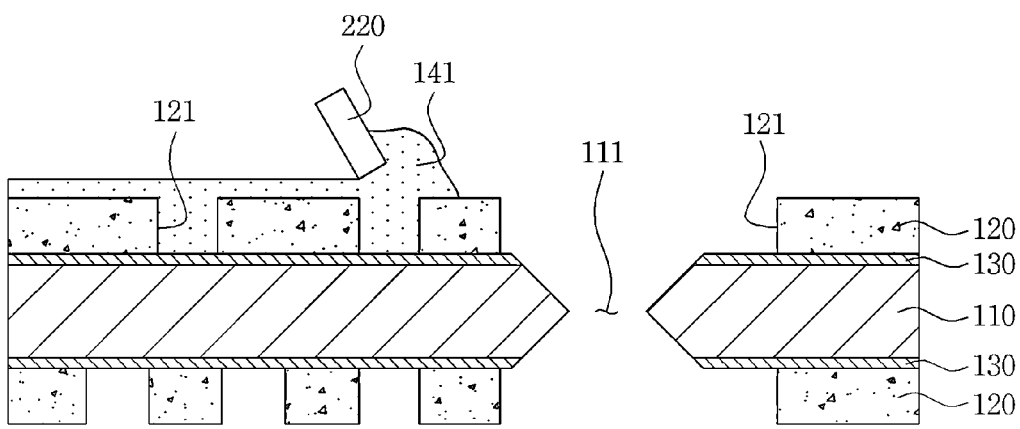
Figure 8:
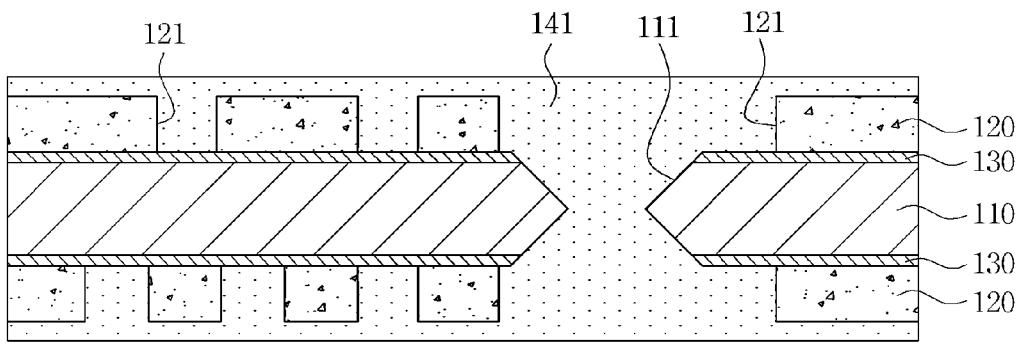
Figure 9:
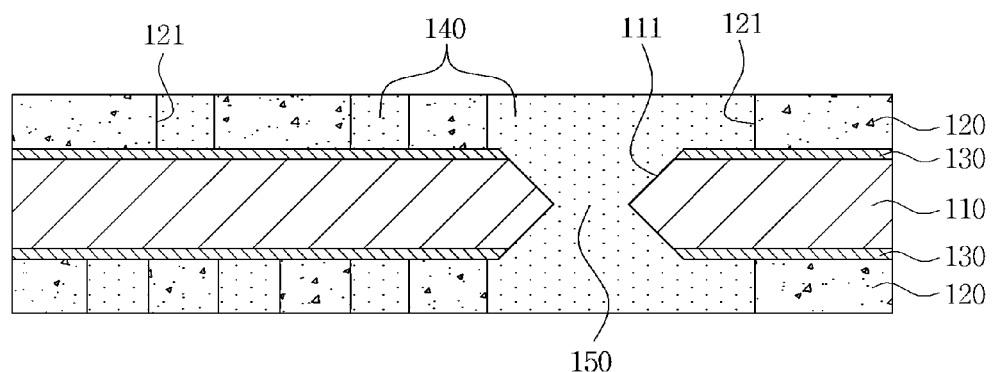

FIGS. 7 to 9 are views illustrating a method of forming circuit patterns according to a preferred embodiment of the present invention.

Referring to FIG. 7, conductive paste 141 may be applied using a screen print method.

Referring to FIG. 8, according to the preferred embodiment, the conductive paste 141 is applied using a squeegee 220 so that openings 121 in the negative photosensitive insulating layers 120 may be filled. In addition, the conductive paste 141 may also fill the through via hole 111 to form the through via 150. As described above, the conductive paste 141 applied using the screen print method may also be applied onto the surfaces of the negative photosensitive insulating layers 120 as well as in the openings 121.

Referring to FIG. 9, circuit patterns 140 may be formed.

Once the conductive paste 141 is applied even on the surfaces of the negative photosensitive insulating layers 120, a polishing process may be performed. The conductive paste 141 may be removed by performing the polishing process until the surfaces of the negative photosensitive insulating layers 120 are exposed. By performing the polishing process, circuit patterns 140 embedded in the negative photosensitive insulating layers 120 may be formed. Additionally, by performing the polishing process, the negative photosensitive insulating layers 120 and the circuit patterns 140 may be planarized even better.

Figure 10:
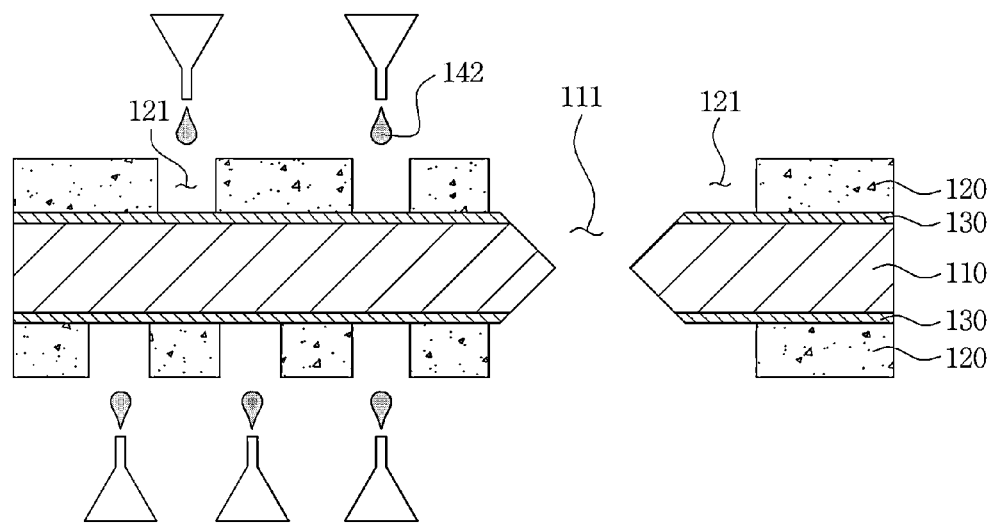
Figure 11:
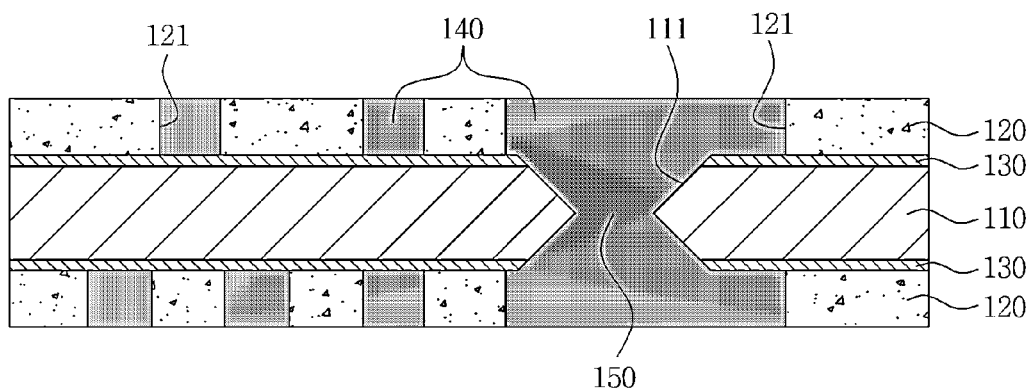

FIGS. 10 and 11 are views illustrating a method of forming circuit patterns according to another preferred embodiment of the present invention.

Referring to FIG. 10, conductive ink 142 may be applied using an ink jet method.

According to the another preferred embodiment of the present invention, the conductive ink 142 may fill the openings 121 in the negative photosensitive insulating layers 120 using the ink jet method. In addition, the conductive ink 142 may also fill the through via hole 111. Since the conductive ink 142 fills in the openings 121 in the negative photosensitive insulating layers 120, no additional buried pattern is required. Here, the buried pattern refers to a pattern formed for preventing circuit patterns from being deformed due to flowability of the conductive ink 142.

Referring to FIG. 11, circuit patterns 140 may be formed.

The conductive ink 142 fills all of the openings 121, circuit patterns 140 embedded in the negative photosensitive insulating layers 120 may be formed. In addition, the conductive ink 142 may also fill the through via hole 111 to form the through via 150.

Figure 12:
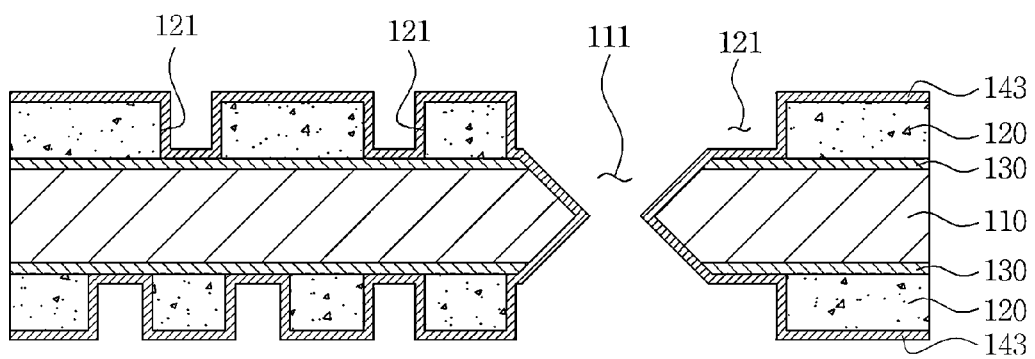
Figure 13:
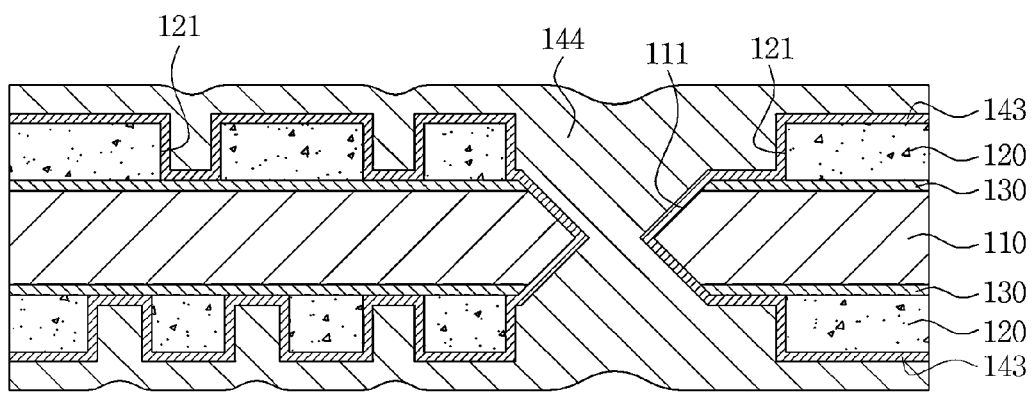
Figure 14:
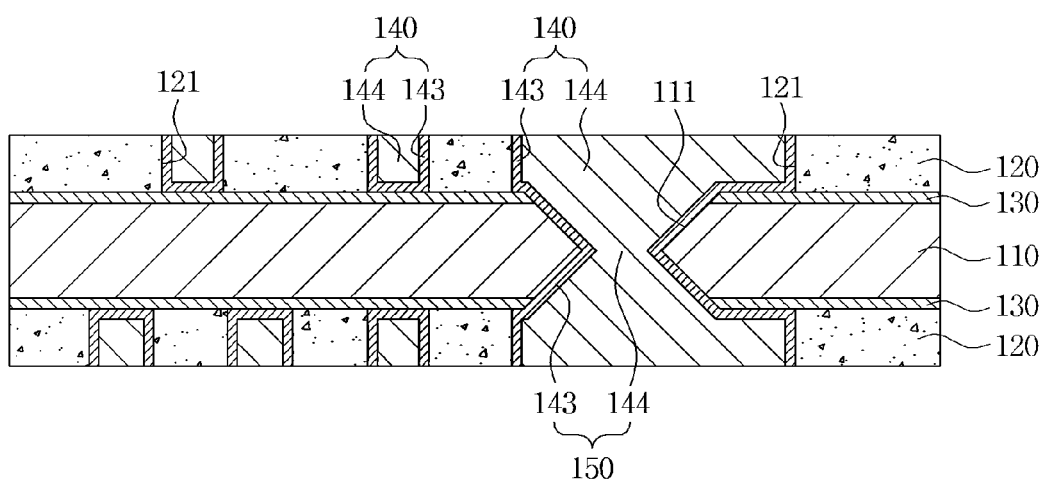

FIGS. 12 to 14 are views illustrating a method of forming circuit patterns according to yet another preferred embodiment of the present invention.

Referring to FIG. 12, seed layers 143 may be formed.

The seed layers 143 may be formed on the surfaces of the negative photosensitive insulating layers 120, on inner walls of the openings 121, and on surfaces of the glass substrate 110 exposed through the openings. In addition, the seed layers 143 may also be formed on inner walls of the through via hole 111. The seed layers 143 may be formed by a sputtering method or an electroless plating method. The method for forming the seed layers 143 is not limited to the methods but may include any one of seed layer forming methods known in the circuit board field. The seed layers 143 may be made of a conductive metal. For example, the seed layer 143 may be made of copper. However, the material of the seed layers 143 is not limited to copper.

Referring to FIG. 13, plating layers 144 may be formed.

The plating layers 144 may be formed by performing an electro plating method on the seed layers 143. The plating layers 144 may be made of a conductive metal. For example, the plating layers 144 may be made of copper. However, the material of the plating layers 144 is not limited to copper. As shown in FIG. 13, the plating layers 144 may be formed on the negative photosensitive insulating layers 120 as well as in the openings 121.

Referring to FIG. 14, circuit patterns 140 may be formed.

Once the plating layers 144 are plated even on the surfaces of the negative photosensitive insulating layers 120, a polishing process may be performed. The plating layers 144 may be removed by performing the polishing process until the surfaces of the negative photosensitive insulating layers 120 are exposed. Accordingly, circuit patterns 140 having seed layers 143 and the plating layers 144 embedded in the negative photosensitive insulating layers 120 may be formed. Further, the through via 150 having the seed layers 143 and plating layers 144 formed in the through via hole 111 may be formed.

By performing the polishing process, circuit patterns 140 embedded in the negative photosensitive insulating layers 120 may be formed. Additionally, by performing the polishing process, the negative photosensitive insulating layers 120 and the circuit patterns 140 may be planarized even better.

Any conductive material used in the circuit board field may be used for the conductive paste 141, the conductive ink 142, the seed layers 143 and the plating layers 144 of the present invention.

In the method of manufacturing a printed circuit board according to the preferred embodiments of the present invention, by using a glass substrate, the printed circuit board can have higher rigidity and can be less deformed by changes in temperature and humidity. In other words, according to the method of manufacturing a printed circuit board, warpage of the printed circuit board can be reduced. Further, according to the method of manufacturing a printed circuit board, since the glass substrate is flexible, it is easy to apply a roll-to-roll process. Moreover, the flexible glass substrate has low brittleness so that it is less likely to be broken by external impact and makes it easier to manufacture a printed circuit board having a curved surface. Further, according to the method of manufacturing a printed circuit board, by using the negative photosensitive insulating layers, it is possible to save cost, compared with positive photosensitive insulating layers. In addition, according to the method of manufacturing a printed circuit board, circuit patterns are formed by filling the openings in the negative photosensitive insulating layers with a conductive material, thereby preventing undercuts occurring on the circuit patterns.

Although the negative photosensitive insulating layers and circuit patterns have one-layer structure in the printed circuit board and in the method of manufacturing the printed circuit board, the number of layers of the printed circuit board is not limited thereto. Multiple build-up layers may be further formed on the printed circuit board according to the preferred embodiments of the present invention as required by those skilled in the art.

According to the preferred embodiments of the present invention, undercuts can be prevented by way of forming embedded circuit patterns.

Further, according to the preferred embodiments of the present invention, rigidity of the printed circuit board can be enhanced by using the glass substrate.

In addition, according to the preferred embodiments of the present invention, warpage of the printed circuit board can be reduced by using the glass substrate.

Moreover, according to the preferred embodiments of the present invention, cost can be saved by using the negative photosensitive insulating layer.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A printed circuit board comprising:
   a light-blocking glass substrate;
   a negative photosensitive insulating layer formed on the glass substrate; and
   a circuit pattern formed on the glass substrate and embedded in the negative photosensitive insulating layer,
   wherein the negative photosensitive insulating layer is formed on either side of the glass substrate.

2. The printed circuit board as set forth in claim 1, further comprising a through via penetrating through the glass substrate and connected to the circuit pattern.

3. The printed circuit board as set forth in claim 1, further comprising an adhesive layer formed between the glass substrate and the negative photosensitive insulating layer.

4. The printed circuit board as set forth in claim 1, wherein the glass substrate is opaque.

5. The printed circuit board as set forth in claim 1, wherein the glass substrate is a flexible glass plate.

* * * * *